United States Patent [19]

Cho

[11] Patent Number: 5,387,548
[45] Date of Patent: Feb. 7, 1995

[54] METHOD OF FORMING AN ETCHED OHMIC CONTACT

[75] Inventor: Jaeshin Cho, Gilbert, Ariz.

[73] Assignee: Motorola, Inc., Schaumburg, Ill.

[21] Appl. No.: 131,920

[22] Filed: Oct. 4, 1993

Related U.S. Application Data

[63] Continuation of Ser. No. 902,244, Jun. 22, 1992, abandoned.

[51] Int. Cl.[6] ............................................ H01L 21/44
[52] U.S. Cl. ................................... 437/184; 437/190; 437/202; 437/246; 148/DIG. 20
[58] Field of Search ................ 437/184, 187, 188, 176, 437/177, 22, 201, 246, 247, 190, 202; 148/DIG. 20, DIG. 40, DIG. 90, DIG. 107

[56] References Cited

U.S. PATENT DOCUMENTS

| | | | |
|---|---|---|---|
| 4,179,533 | 12/1979 | Christou et al. | 437/190 |
| 4,313,971 | 2/1982 | Wheatley, Jr. | 437/176 |
| 4,332,837 | 6/1982 | Peyre-Larigne | 437/201 |
| 4,545,116 | 10/1985 | Lau | 437/201 |
| 4,641,420 | 2/1987 | Lee | 148/DIG. 20 |
| 4,804,438 | 2/1989 | Rhode | 156/653 |
| 4,839,303 | 6/1989 | Tully et al. | 437/22 |
| 4,902,635 | 2/1990 | Imamura et al. | 148/DIG. 20 |
| 4,989,065 | 1/1991 | Tsuchimoto et al. | 437/184 |
| 5,024,971 | 6/1991 | Baker et al. | 148/DIG. 147 |
| 5,045,502 | 9/1991 | Lau et al. | 437/184 |
| 5,091,338 | 2/1992 | Tsuchimoto et al. | 437/184 |
| 5,093,280 | 3/1992 | Tully | 437/184 |
| 5,100,835 | 3/1992 | Zheng | 148/DIG. 20 |
| 5,143,856 | 9/1992 | Iwasaki | 437/22 |
| 5,144,410 | 9/1992 | Johnson | 148/DIG.20 |
| 5,275,971 | 1/1994 | Wu et al. | 437/184 |

FOREIGN PATENT DOCUMENTS

| | | | |
|---|---|---|---|
| 55-120132 | 9/1980 | Japan | 437/177 |
| 62-90930 | 10/1985 | Japan | 437/184 |
| 62-48048 | 3/1987 | Japan | 437/192 |
| 62-149125 | 7/1987 | Japan | 437/184 |
| 62-149138 | 7/1987 | Japan | 437/187 |
| 63-95620 | 4/1988 | Japan | 437/184 |
| 64-02320 | 1/1989 | Japan | 437/177 |

OTHER PUBLICATIONS

Kopawa et al., "Stable Solid Phase Contact to n–GaAs", IEEE Trans. on Electron Devices, 36(6), Jun. 1989.

Primary Examiner—Tom Thomas
Assistant Examiner—Michael Trinh
Attorney, Agent, or Firm—Joe E. Barbee

[57] ABSTRACT

The present invention includes forming an etched ohmic contact (10, 9) by applying a layer of an etch susceptible contact material (14) to a III–V semiconductor substrate (11). A portion of the contact layer (14A) is alloyed with the substrate (11) to form are etch resistant area (14A) of the contact layer. The contact layer (14) is selectively etched to remove etch susceptible portions of the contact layer while leaving the etch resistant area (14A) on the substrate (11). Another alloy operation is performed to form ohmic contact between the etch resistant area (14A) and the substrate (11). Consequently, an etch ohmic contact (10, 9) that is substantially devoid of gold is formed.

18 Claims, 2 Drawing Sheets

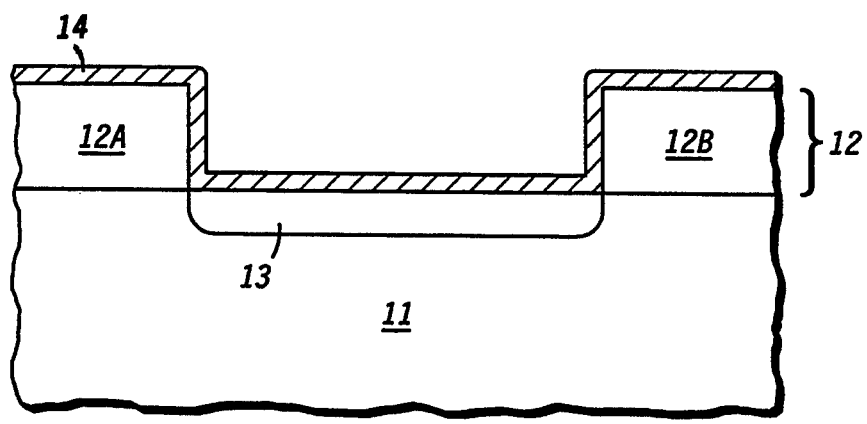
FIG. 1
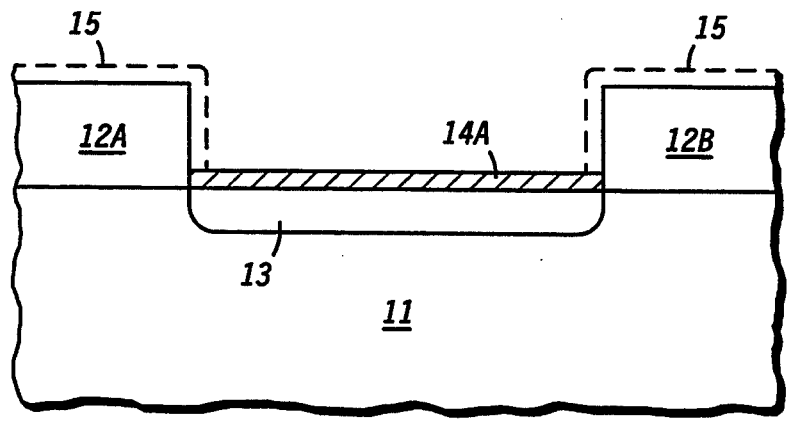
FIG. 2
FIG. 3
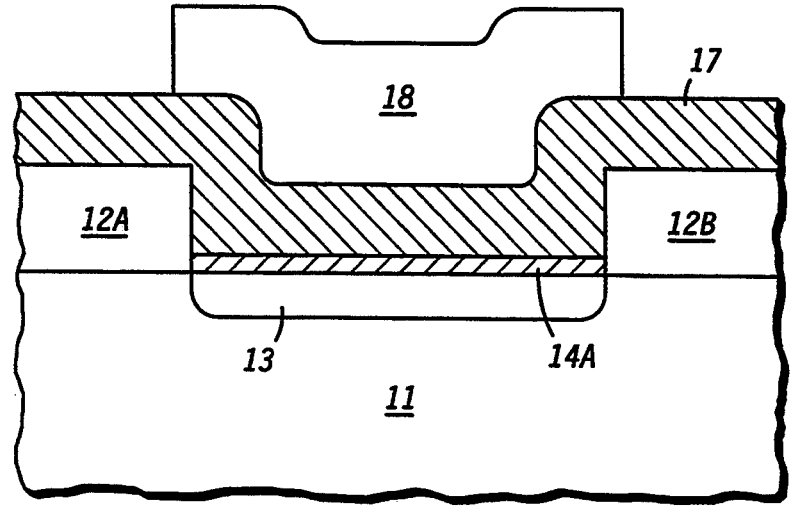

METHOD OF FORMING AN ETCHED OHMIC CONTACT

This application is a continuation of prior application Ser. No. 07/902,244, filed Jun. 22, 1992, now abandoned.

The present invention relates, in general, to semiconductor devices, and more particularly, to a novel method of forming ohmic contacts to semiconductor devices.

In the past, the semiconductor industry has utilized various multi-layer metal structures to form ohmic contacts to III–V semiconductor devices. These prior ohmic contacts typically include a layer of gold to lower the multi-layer metal structure's contact potential thereby facilitating the ohmic contact formation. Gold degrades the contact's thermal stability and renders the contacts unsuitable for processes requiring temperatures in excess of approximately 350° C.

Since it is not possible to etch gold, lift-off process are typically employed to form such gold containing ohmic contacts. Lift-off techniques require very accurate control of the multi-layer metal structure's step coverage. Also, the sidewall profile of photoresist used as masks during the lift-off operation must be accurately controlled. This requirement for accurate sidewall and step coverage control results in low process yields and high manufacturing costs.

In addition, lift-off techniques generally have a minimum spacing of approximately one micron between the ohmic contact and adjacent structures. Such minimum spacing requirements limit the minimum transistor width that can be obtained from these prior lift-off techniques to approximately seven to eight microns.

Accordingly, it is desirable to have ohmic contacts that are produced by etching instead of lift-off techniques, and that are devoid of gold.

SUMMARY OF THE INVENTION

Briefly stated, the present invention includes applying a layer of an etch susceptible contact material to a III–V semiconductor substrate. A portion of the contact layer is alloyed with the substrate to form an etch resistant area of the contact layer. The contact layer is selectively etched to remove the etch susceptible portions while leaving the etch resistant area. Another alloy operation is performed to form ohmic contact between the etch resistant area and the substrate. Consequently, an etched ohmic contact that is substantially devoid of gold is produced.

BRIEF DESCRIPTION OF THE DRAWINGS

FIG. 1 is an enlarged cross-section illustrating a stage in the formation of an ohmic contact in accordance with the present invention;

FIG. 2 and FIG. 3 illustrate the contact of FIG. 1 at subsequent stages of formation in accordance with the present invention;

DETAILED DESCRIPTION OF THE DRAWINGS

Figure 4:
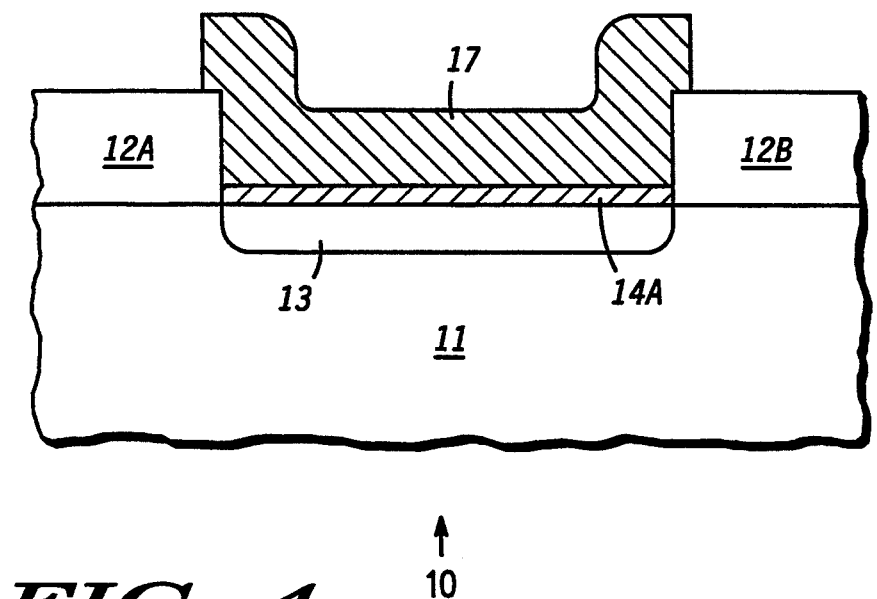
FIG. 4 illustrates an enlarged cross-section of the contact of FIG. 1 after forming ohmic contact in accordance with the present invention.

FIG. 1 illustrates a stage in forming an embodiment of an ohmic contact 10. Contact 10 is shown on a III–V semiconductor substrate 11 that is covered with a dielectric layer 12. An opening through dielectric layer 12 exposes a portion of the surface of substrate 11, and divides dielectric layer 12 into dielectric portions 12A and 12B that function as field oxide regions. Such field oxide regions typically are employed as part of the isolation between adjacent electrodes of a semiconductor device, between adjacent transistors, or other semiconductor structures. Suitable materials for dielectric 12 include, but are not limited to, silicon dioxide ($SiO_2$) and silicon nit ride ($Si_3N_4$). The exposed surface of substrate 11 is doped thereby forming low resistance area typically referred to as a preohmic 13.

A contact layer 14 is then deposited to cover dielectric portions 12A and 12B, the sidewalls of the opening between dielectric portions 12A and 12B, and preohmic 13. Contact layer 14 is formed from a material which is highly reactive with the III–V material of substrate 11 thereby facilitating the subsequent formation of alloys between the materials of layer 14 and preohmic 13. Two materials that are suitable for use as layer 14 are nickel (Ni) and palladium (Pd). Layer 14 has a thickness of approximately ten to fifty nanometers in order to provide a uniform interface between substrate 11 and layer 14. In the preferred embodiment, sputtering is employed to form approximately twenty nanometers of nickel for contact layer 14.

A first alloying procedure is utilized to form contact layer 14 into an etch resistant area and etch susceptible areas. The first alloying procedure creates alloys of the material used for preohmic 13 and the portion of contact layer 14 that is covering preohmic 13. These alloys are insoluble in some chemicals that dissolve non-alloyed portions of contact layer 14 thereby creating the etch resistant area covering preohmic 13. Hydrochloric acid (HCl) is one chemical that can selectively etch the etch susceptible portions of contact layer 14. The alloys typically are formed by heating contact 10 to a temperature of approximately 300 to 400 degrees Celsius (300° C.–400° C.) in an inert atmosphere. These temperatures are lower than the temperatures used for forming ohmic contacts in order to reduce pitting at the surface of preohmic 13. In the preferred embodiment, a rapid thermal anneal procedure is used to heat contact 10 to approximately 400° C. for about one minute.

Since some III–V materials, such as arsenic, have a high vapor pressure, portions of the III–V material may out-diffuse through layer 14 during the first alloying operation and cause pitting at the surface of preohmic 13. In order to prevent such out-diffusion, the surface of contact layer 14 may be covered with a silicon nitride ($Si_3N_4$) or silicon dioxide ($SiO_2$) barrier layer.

Referring to FIG. 2, once the etch resistant area is formed contact 10 is exposed to HCl to selectively remove the etch susceptible portions of contact layer 14 (FIG. 1) which are covering dielectric portions 12A and 12B, and the sidewalls of portions 12A and 12B. This selective etching leaves a contact alloy 14A covering preohmic 13. The removed portions of layer 14 are indicated by a dashed line 15. The HCl etch generally is conducted for about ten to twenty minutes at a temperature ranging from approximately twenty-five to seventy-five degrees Celsius. In the preferred embodiment, the etch is performed for approximately fifteen minutes at forty degrees Celsius.

Since the etch susceptible portions of contact layer 14 are removed by selective etching, there is no need for clearance areas between contact 10 and adjacent structures, such as adjacent dielectric portions 12A and 12B. Consequently, contact 10 can abut such adjacent structures and can be formed at the minimum dimensions that can be produced by lithographic equipment employed in forming contact 10. This is a significant advantage over prior art contacts that employ lift-off processing methods.

FIG. 3 illustrates a subsequent stage in forming ohmic contact 10. Portions of FIG. 3 that are the same as FIG. 2 have the same reference numerals. After forming contact alloy 14A, a refractory metal layer 17 is applied covering alloy 14A, dielectric portions 12A and 12B, and the sidewalls of dielectric portions 12A and 12B. Layer 17 generally has a thickness of about 100 to 300 nanometers to prevent out-diffusion of III-V materials from preohmic 13 during subsequently performed alloying operations. Refractory metals suitable for layer 17 include, but are not limited to, titanium (Ti), tungsten (W), and molybdenum (Mo). In the preferred embodiment, sputtering is employed to apply approximately 200 nanometers of tungsten (W) as contact layer 17. Portions of layer 17 outside the opening between dielectric 12A and 12B are removed by applying a photoresist mask 18 and etching the exposed portions of layer 17. Mask 18 overlays portions of dielectric 12A and 12B to ensure that the portion of layer 17 overlying contact alloy 14A is not etched. In order to form well defined vertical edges, exposed portions of layer 17 are anisotropically etched using a reactive ion etch with a fluorine atmosphere.

Referring to FIG. 4, mask 18 of FIG. 3 is removed and a second alloying operation is performed to create a low resistance ohmic contact between contact alloy 14A and preohmic 13. The second alloying operation is performed at a temperature of 530° C. to 575° C. in order to provide a low resistance contact. The alloying generally is conducted for a time between approximately thirty seconds and five minutes. In the preferred embodiment rapid thermal anneal is utilized to heat contact alloy 14A and preohmic 13 to approximately 550° C. for approximately one minute in an inert atmosphere.

Figure 5:
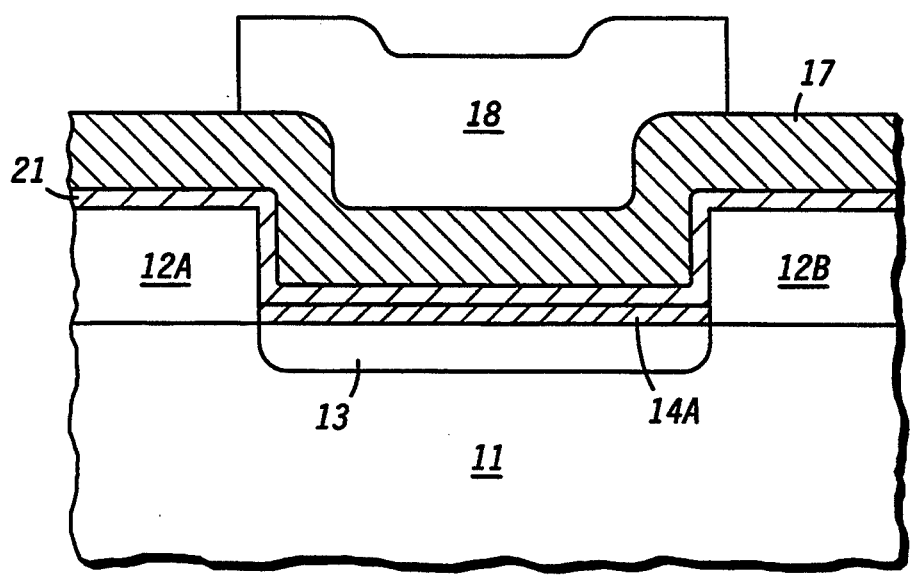
FIG. 5 illustrates a stage in the formation of an alternate embodiment of an ohmic contact in accordance with the present invention.

FIG. 5 illustrates an alternate embodiment of an ohmic contact 9 at a manufacturing stage as illustrated in FIG. 3. Elements of FIG. 5 that are the same as FIG. 3 have the same reference numerals. Subsequent to forming contact alloy 14A, a thermal stability layer 21 is applied covering contact alloy 14A, dielectric portions 12A and 12B, and the sidewalls of dielectric portions 12A and 12B. The material used for thermal stability layer 21 will subsequently be alloyed with the material of contact alloy 14A in order to form high melting temperature alloys at the interface between contact alloy 14A and preohmic 13. These high melting temperature alloys provide ohmic contact 9 with improved thermal stability at high temperatures. Suitable materials for stability layer 21 include silicon and germanium. The thickness of layer 21 should be approximately equal to the thickness of layer 14 of FIG. 1 (approximately 10 to 50 nanometers). In the preferred embodiment, approximately 20 nanometers of germanium are used for layer 21. Subsequently, refractory metal layer 17 is applied and mask 18 is formed as described in FIG. 3. Contact 9 is completed as described in FIG. 3 and FIG. 4.

By now it should be appreciated that there has been provided a novel method for forming etched ohmic contacts on III-V semiconductor materials. Selectively etching the contact layer to leave a contact alloy on the III-V material eliminates the need for lift-off processing, thus, producing higher yields and lower costs. Also, the methods used to form the etched contact are very repeatable thereby further reducing costs. Since the contact is formed by etching instead of lift-off techniques, the contact can be formed to abut adjacent structures. Therefore, transistors having widths of approximately two microns or less can be formed.

I claim:

1. A method of forming an etched ohmic contact comprising:

providing a gallium arsenide substrate having a surface;

covering the surface of the substrate with a first dielectric;

forming an opening through the first dielectric thereby exposing a portion of the surface of the substrate;

doping the portion of the surface of the substrate for forming a preohmic area;

covering the first dielectric and the preohmic area with a contact layer consisting essentially of nickel or palladium;

forming the contact layer into an etch resistant area and an etch susceptible area wherein the etch resistant area is formed by alloying the preohmic area with the contact layer that is covering the preohmic area and wherein the etch susceptible area includes the contact layer that is covering the first dielectric;

leaving the etch resistant area covering the preohmic area while removing the etch susceptible area by selectively etching the etch susceptible area;

covering the first dielectric and the etch resistant area with a refractory metal;

etching portions of the refractory metal covering the first dielectric for the purpose of removing the portions of the refractory metal while leaving refractory metal covering the etch resistant area; and forming an ohmic contact between the etch resistant area and the preohmic area by alloying the etch resistant area and the preohmic area.

2. The method of claim 1 wherein forming the contact layer into the etch resistant area includes using a rapid thermal anneal for heating the preohmic area and the contact layer to a temperature of approximately 300 to 400 degrees Celsius for a time between approximately thirty seconds and five minutes in an inert atmosphere.

3. The method of claim 1 wherein leaving the etch resistant area covering the preohmic area while removing the etch susceptible area by selectively etching the etch susceptible area includes exposing the etch resistant area and the etch susceptible area to hydrochloric acid at a temperature between 25 and 70 degrees Celsius for approximately 10 to 20 minutes.

4. The method of claim 1 wherein etching portions of the refractory metal covering the first dielectric for the purpose of removing the portions of the refractory metal while leaving refractory metal covering the etch resistant area includes forming a photoresist mask covering the refractory metal that is overlying the etch resistant area and also covering an adjacent portion of the first dielectric, then etching exposed portions of the refractory metal.

5. The method of claim 1 wherein covering the first dielectric and the etch resistant area with the refractory metal includes covering the first dielectric and the etch resistant area with a layer of germanium, then covering the layer of germanium with the refractory metal.

6. The method of claim 1 wherein covering the first dielectric and the preohmic area with the contact layer includes covering the first dielectric and the preohmic area with a material consisting essentially of nickel or palladium, then covering the material with a second dielectric.

7. The method of claim 1 wherein covering the first dielectric and the preohmic area with the contact layer includes covering the first dielectric and the preohmic area with the contact layer that has a thickness of approximately 10 to 50 nanometers.

8. The method of claim 1 wherein covering the first dielectric and the etch resistant area with the refractory metal includes covering the first dielectric and the etch resistant area with the refractory metal that has a thickness of approximately 100 to 300 nanometers.

9. The method of claim 1 wherein covering the first dielectric and the etch resistant area with the refractory metal includes covering the first dielectric and the etch resistant area with a metal selected from the group consisting of titanium, tungsten, and molybdenum.

10. A method of forming an ohmic contact comprising:
providing a III–V semiconductor substrate;
forming a dielectric on a portion of the substrate;
applying an etch susceptible contact layer consisting essentially of nickel or palladium to the substrate and to the dielectric;
alloying the contact layer with the substrate for forming the contact layer that is on the substrate into an etch resistant area while leaving remaining portions of the contact layer as an etch susceptible area;
selectively etching the contact layer for the purpose of removing the etch susceptible area while leaving the etch resistant area; and
forming ohmic contact between the etch resistant area and the substrate by alloying the etch resistant area with the substrate wherein the ohmic contact is substantially devoid of gold.

11. The method of claim 10 wherein alloying the contact layer with the substrate includes heating the contact layer and the substrate to a temperature of approximately 300 to 400 degrees Celsius for a time between approximately thirty seconds and five minutes in an inert atmosphere.

12. A method of forming an ohmic contact comprising:
providing a III–V semiconductor substrate:
forming a dielectric on a portion of the substrate;
applying an etch susceptible contact layer consisting essentially of nickel or palladium to the substrate and to the dielectric:
alloying the contact layer with the substrate forming the contact layer that is on the substrate into an etch resistant area while leaving remaining portions of the contact layer as an etch susceptible area;
selectively etching the contact layer with hydrochloric acid for approximately 10 to 20 minutes at a temperature of approximately 25 to 70 degrees Celsius for the purpose of removing the etch susceptible area while leaving the etch resistant area; and
forming ohmic contact between the etch resistant area and the substrate by alloying the etch resistant area with the substrate wherein the ohmic contact is substantially devoid of gold.

13. A method of forming an ohmic contact comprising:
forming a dielectric on a portion of a III–V semiconductor substrate;
forming a contact layer having a first portion in contact with the III–V semiconductor substrate and a second portion overlaying the dielectric;
forming the first portion into an etch resistant area by alloying in a first alloy operation the first portion of the contact layer with the substrate while leaving the second portion of the contact layer as an etch susceptible area;
selectively etching the etch susceptible area for removing the etch susceptible area while leaving the etch resistant area; and
forming an ohmic contact between the etch resistant area and the substrate by alloying in a second alloy operation the etch resistant area with the substrate.

14. The method of claim 13 further including covering the etch resistant area with a refractory metal.

15. The method of claim 14 wherein covering the etch resistant area with the refractory metal includes covering the etch resistant area with a layer of germanium, then covering the germanium with the refractory metal.

16. The method of claim 14 wherein covering the etch resistant area with the refractory metal includes sputtering the refractory metal onto the etch resistant area.

17. The method of claim 13 wherein selectively etching the etch susceptible area includes selectively etching the etch susceptible area with hydrochloric acid for approximately 10 to 20 minutes at a temperature of approximately 25 to 70 degrees Celsius.

18. The method of claim 13 wherein forming the ohmic contact between the etch resistant area and the substrate includes using a rapid thermal anneal for heating the etch resistant area and the substrate to approximately 530 to 575 degrees Celsius for approximately thirty-five seconds to five minutes in an inert atmosphere.

* * * * *

UNITED STATES PATENT AND TRADEMARK OFFICE
CERTIFICATE OF CORRECTION

PATENT NO. : 5,387,548
DATED : February 7, 1995
INVENTOR(S) : Jaeshin Cho

It is certified that error appears in the above-indentified patent and that said Letters Patent is hereby corrected as shown below:

Column 6, line 25, claim 13, "overlaying" should read --overlying--.

Signed and Sealed this

Twenty-third Day of May, 1995

Attest:

BRUCE LEHMAN

*Attesting Officer*      *Commissioner of Patents and Trademarks*